May 7, 1963 B. BIRKENES 3,089,087
RADIO RECEIVER
Filed March 24, 1959
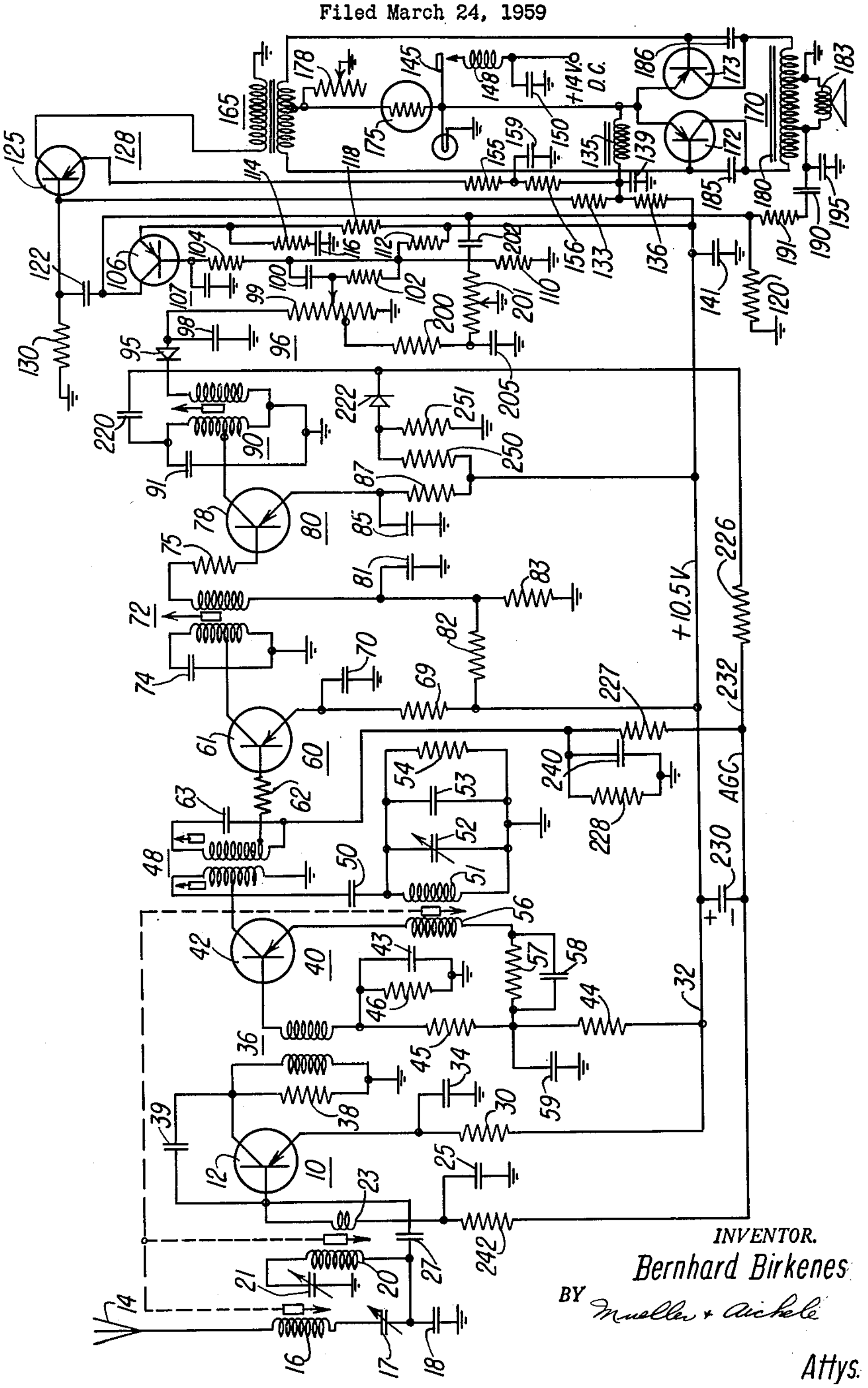
INVENTOR.
Bernhard Birkenes
BY Mueller + Aichele
Attys.

United States Patent Office 3,089,087

Patented May 7, 1963

3,089,087

RADIO RECEIVER

Bernhard Birkenes, Chicago, Ill., assignor to Motorola, Inc., Chicago, Ill., a corporation of Illinois Filed Mar. 24, 1959, Ser. No. 801,553
7 Claims. (Cl. 325—319)

This invention relates to radio receivers and more particularly to transistorized receivers having automatic gain control circuits.

In most present day receivers it is desirable to have provision for automatic control of the receiver gain which is dependent upon the strength of a received signal. This is particularly important in portable receivers or mobile receivers, such as used in automobiles, which should have high sensitivity for reception of weak signals and then be automatically controllable to a condition of low sensitivity when the receiver is used in a strong signal area. In previously known transistorized receivers difficulty has been experienced in obtaining effective gain control potential to reduce the receiver gain sufficiently to avoid distortion of high level input signals. Some of these receivers have even utilized an extra transistor as an automatic gain control amplifier in order to develop the desired gain control action.

A further problem involved in such gain control systems, particularly in transistorized receivers used in automobiles and operating from automobile generators, is concerned with the very large capacitors necessary in the gain control filtering network to bypass the audio and radio frequencies of a detected carrier. A capacitor of large value in the system can promote undesirable gain variation upon a change in B+ voltage, for example, as the auto generator voltage varies. In addition, such a capacitor may cause the gain control system to be slow in recovery. For example, there can be a delay in proper control as the signal level sharply increases in the case of an auto receiver emerging from under a metal bridge where the signal level may be very low.

It is an object of this invention to overcome the above described defects by means of an improved gain control system in a transistorized receiver which utilizes simple and inexpensive circuitry.

Another object is to improve the large signal handling capabilities of a transistorized receiver and thereby reduce signal distortion in the receiver.

A further object is to reduce the tendency for gain variation in transistor receivers, particularly those adapted to be operated from the electrical system of an automobile or other vehicle in which the supply voltage tends to vary.

An additional object is to increase the speed of response of an automatic gain control system in a transistor receiver so that rapid signal level changes can be handled without undesirable receiver performance.

A still further object is to reduce the spurious signal response of a transistor radio receiver of the type suitable for use in automobiles.

A feature of the invention is the provision of an improved automatic gain control detector circuit for a transistor receiver wherein the quiescent bias for the gain controlled stages is applied in series with the automatic gain control potential to reduce the loading of the gain control system so that increased control potentials can be developed for improved receiver regulation at high signal levels.

Another feature of the invention is the provision of an automatic gain control system for regulation of relatively low impedance circuits, such as the transistors in radio frequency or intermediate frequency amplifiers, and in which system the resistor-capacitor detector load network includes a relatively large capacitor which is coupled to the transistor input electrodes, or an operating potential supply source subject to potential variation, in such a way as to reduce the adverse effects of a charge change thereon upon supply potential variation or large input signal change.

Another feature is the provision of a tuned input network for a transistor intermediate frequency amplifier stage including a suppressor, or isolating resistor through which a gain control potential and bias may be applied to the transistor for gain control thereof.

A still further feature of the invention is the provision of a tuned antenna input circuit and image rejection trap through which a gain control and bias potential may be applied to the first stage of a transistor radio receiver.

The drawing shows a schematic diagram of a radio receiver incorporating the invention.

In a particular form of the invention the gain control system is used to control the base electrode potentials of transistors in the radio frequency and intermediate frequency amplifiers of a radio receiver. The radio frequency transistor stage preferably includes a tuned circuit for the received signal combined with a tunable image trap to improve the receiver image rejection. The intermediate frequency transistor stage incorporates a tuned circuit coupled to the transistor through an isolating resistor to stabilize the circuit, and it is through this resistor and the radio frequency stage tuned circuit that the bias and gain control potentials are applied to these transistors.

In order to develop such potentials a rectifier and interconnected resistor-capacitor network are coupled to a signal translating channel in the receiver. A direct current bias potential divider network is series connected to such detector circuit and associated load capacitor so that the direct current voltage provided by the bias network is also developed across the output network of the automatic gain control system. The base electrodes of the transistors are coupled to a resistor of the network and the transistors are thus biased by the direct current bias potential and the automatic gain control potential which is dependent upon the strength of a received signal. Since no further quiescent base bias need be provided for these transistors, there are no circuits to shunt or load the gain control network and reduce the effectiveness thereof.

Due to the fact that the gain controlled circuits have a relatively low impedance input, the resistor-capacitor load network for the automatic gain control detector utilizes a relatively large capacitor and small resistance to reduce the losses caused by the transistor input impedances. The large integrating or filter capacitor is coupled in such a way that the direct current voltages thereacross, except for the detected automatic gain control voltage, are minimized. For example, this capacitor may be returned to the transistor emitters or to B+, and not to a reference ground. Therefore, B+ variations as may occur in vehicle electrical systems, or rapid and large input signal increase as occurs when the vehicle radio emerges from under a bridge, have minimum influence on a charge change of this capacitor and thus a minimum adverse influence on the receiver gain.

In the drawing the receiver shown is one adapted for use in an automobile and for operation directly from a normal 12 volt battery and generator. The receiver includes a radio frequency amplifier stage 10 having a transistor 12. A tuned network for selecting a desired signal is connected between the base of transistor 12 and the antenna 14. This network includes a slug tunable inductor 16 connected to the antenna 14 and capacitors 17 and 18 series connected between the inductor 16 and ground. Inductor 20 is coupled between the junction of capacitors 17, 18 and the capacitor 21 which is connected to ground. Inductor 23 is closely coupled to inductor 20 and is connected between the base of transistor 12 and ground through the bypass capacitor 25. Inductors 20, 23 are also slug tuned. Capacitors 17 and 21 are variable for alignment.

This input network forms a double tuned circuit with inductor 16 and capacitors 17 and 18 parallel tuned to the input signal. Capacitor 18 also provides coupling to a second tuned circuit comprising capacitor 18, inductor 20 and capacitor 21 which are also tuned to the signal. The signal is then inductively coupled to winding 23 and applied to the transistor 12. This network thus provides a desirable impedance match to the antenna 14 by means of a parallel resonant circuit and further provides a desirable low impedance match for the input electrode of transistor 12.

The input network further forms an image rejection trap. The image frequency in a superheterodyne receiver of the type being desribed will be spaced from the frequency to which the local oscillator is tuned by an amount equal to the intermediate frequency of the receiver. For example, if the local oscillator is tuned above the desired signal, the image would be at a frequency equal to twice the intermediate frequency plus the desired signal frequency. Inductor 23 together with capacitor 18 and capacitor 27, which latter capacitor is connected between the base electrode of transistor 12 and junction of capacitors 17, 18, are tuned to the image frequency. Thus, there is a tendency for the image signal to be developed across the inductor 23. However, the image signal is also developed across inductor 20 and this is coupled into inductor 23 with an opposing phase so as to minimize the image signal which tends to be developed in inductor 23.

It should also be noted that tuning of the inductors 20, 23 will effect tuning of the image rejection trap so that the input network to the receiver provides double tuning of the desired signal, rejection of the image frequency, and impedance matching of the antenna to the transistor 12.

Amplifier stage 10 also includes an emitter stabilizing resistor 30 connected between the emitter electrode and potential supply lead 32. The emitter electrode is bypassed for signals by means of capacitor 34. The output of the stage 10 is derived in a transformer 36 having a primary winding which is connected between ground and the collector of transistor 12. This winding is shunted by means of a resistor 38. A neutralizing capacitor 39 is also connected between the collector and base electrodes of the transistor.

The secondary of the transformer 36 is coupled to the base electrode of transistor 42 in the converter stage 40. The other side of the secondary winding is bypassed for signals by means of capacitor 43. A base bias for transistor 42 is developed by means of a voltage divider 44, 45, and 46 connected between the lead 32 and ground, with the junction of resistors 45, 46 coupled through the secondary winding of transformer 36 to the base electrode.

The output signals from the converter stage, now at the intermediate frequency, are developed in the primary winding of transformer 48 which includes an impedance matching tap connected to the collector electrode of transistor 42 and an end terminal which is coupled to ground. Local oscillations for heterodyning the incoming signal are provided by the converter stage 40 and the feedback to sustain oscillation is derived from one end of the primary winding of transformer 48 which is coupled through a capacitor 50 to the parallel coupled combination of inductor 51, tracking capacitor 52, capacitor 53 and resistor 54 all of which are also connected to ground. Inductor 51 is inductively coupled to an inductor 56 which is series connected between the emitter electrode of transistor 42 and the parallel connected bias combination of resistor 57 and capacitor 58. Network 57, 58 is connected to the potential supply lead 32 through the resistor 44 which is bypassed to ground through capacitor 59.

Network 57, 58 supplies the emitter bias for the oscillator and inductor 56 provides the feedback to sustain oscillations in the collector-emitter circuit. As is shown, inductors 51, 56 are slug tuned and the tuning provision may be ganged with the tuning provision of the input tuned circuits of amplifier stage 10.

The intermediate frequency amplifier stage 60 includes a transistor 61 having a base electrode connected through resistor 62 to a tap point of the secondary winding of transformer 48. This provides impedance matching to the transistor base. The secondary winding is shunted by a tuning capacitor 63 and one end of this combination is returned to a bias potential source explained subsequently. An emitter stabilizing resistor is coupled between the emitter of transistor 61 and the potential supply lead 32 and the emitter is bypassed for signals by means of capacitor 70. Signals at intermediate frequency are derived from the stage 60 by means of a transformer 72 having a primary winding with an impedance matching tap point connected to the collector of transistor 61. This primary winding is shunted by a tuning capacitor 74 and one end of this combination is grounded.

The secondary winding of transformer 72 has one end terminal connected through isolating resistor 75 to the base electrode of transistor 78 in the intermediate frequency stage 80. The other end terminal of the secondary winding is bypassed to ground by means of capacitor 81 and a bias potential for the base electrode of transistor 78 is developed at the junction point of resistors 82 and 83 which are connected between lead 32 and ground, and this bias potential is applied through the secondary winding to the base electrode. It should be observed that the base electrodes of both transistors 61 and 78 are connected to respective tuned input circuits through isolating resistors which tend to reduce the tendency for feedback in the stages by reducing the coupling of the tuned circuits to the input electrodes of the transistors. This has the advantage of obviating the need for neutralizing capacitors.

In the amplifier stage 80 the emitter of transistor 78 is bypassed to ground through capacitor 85 and is stabilized by means of resistor 87 series connected between the emitter and the potential supply lead 32. Output signals at the intermediate frequency are applied to an impedance matching tap point of the primary winding of transformer 90 from the collector electrode of transistor 78. The primary winding is shunted by means of a tuning capacitor 91 and one end of this combination is connected to ground.

The secondary winding of transformer 90 is coupled between ground and the cathode of a detector diode 95 in the audio detector stage 96. The capacitor 98 and resistor 99 are parallel coupled between the anode of diode 95 and ground to form a detector load for audio signals. A movable tap on resistor 99 may be used as a volume control and this is coupled through the parallel combination of coupling capacitor 100, and its discharge resistor 102, and through resistor 104 to the base electrode of transistor 106 in the first audio amplifier stage 107. The junction of resistors 102 and 104 is connected to the intercoupling of resistors 110 and 112 which are coupled between ground and lead 32, thereby providing a bias for the base of transistor 106. The emitter of transistor 106 is bypassed for signals by means of a series connected resistor 114 and bypass capacitor 116. The emitter is also connected to a positive potential source by means of the stabilizing resistor 118 coupled to lead 32.

The audio signals from stage 107 are developed across resistor 120 connected between the collector of transistor 106 and ground and this collector electrode is coupled through a coupling capacitor 122 to the base electrode of transistor 125 in the second audio stage 128. The base electrode is also connected to ground through an input biasing resistor 130. A base bias voltage divider for transistor 125 is formed with the resistor 130 and resistor 133 which is coupled between the base electrode and choke 135. Choke 135 is coupled to the junction of resistors 133 and 136 and this junction point is bypassed by a filter capacitor 139. Resistor 136 is connected to the potential supply lead 32 and this lead is bypassed by means of a further filter capacitor 141.

The other side of choke 135 is connected through an on-off switch 145 and an input filter choke 148 to a voltage supply terminal which may be connected to the battery-generator system in an automobile providing a nominal 12 or 14 volts with respect to ground. The input of the positive potential operating source is also bypassed to ground through a filter capacitor 150.

In audio amplifier stage 128 the emitter electrode of transistor 125 is stabilized by means of resistors 155 and 156 which are series connected between the emitter and the junction of resistors 133, 136. The junction of resistors 155, 156 is bypassed for signal frequencies by means of capacitor 159. Output signals from the transistor 125 are applied to the primary winding of audio transformer 165 which is connected between the collector electrode and ground.

The secondary winding of transformer 165 is coupled to a push-pull audio output stage 170. The ends of the secondary winding of this transformer are coupled respectively to the base electrodes of transistors 172 and 173. The emitters of these transistors are interconnected and coupled through a thermistor 175 to a center tap of the secondary winding of transformer 165. This center tap is also connected to ground through a variable bias resistor 178. Resistor 178 is used to set the proper collector current of the transistors 172, 173. This resistor together with thermistor 175 provide the emitter bias for the audio output transistors and the thermistor 175 affords temperature stabilization of these power stages with changes in ambient temperature of the receiver.

An output transformer 180 is connected between the collectors of transistors 172, 173 and a loudspeaker 183 is coupled across a portion of this output transformer. Negative feedback for transistors 172, 173 is provided respectively by capacitors 185 and 186 which are coupled between the transistor collectors and bases. Further negative feedback across the final two audio amplifier stages is obtained by means of a series coupled capacitor 190 and resistor 191 connected between one side of the loudspeaker voice coil and the junction of resistor 120 and capacitor 122 in the output circuit of the audio amplifier stage 107. The junction of the capacitor 190 and the speaker voice coil is also bypassed by means of capacitor 195 in order to reduce the effect of noise signals.

A tone control for the receiver is formed by the network including resistor 200, resistor 201 and capacitor 202 series coupled between a tap point of resistor 99 and the collector of transistor 106. The junction of resistors 200, 201 is bypassed through capacitor 205 and a movable tap on the tone control 201 is connected to ground. By this means the frequency response in the audio amplifier system can be varied from accentuation of the bass or lower frequencies to accentuation of the treble or higher frequencies.

The receiver also includes circuitry which provides quiescent bias potentials for the base electrodes of transistors 12 and 61 and automatic gain control or AGC potentials to control the gain of these stages. It may be noted that the primary winding of transformer 90 in the intermediate frequency amplifier stage 80 together with its tuning capacitor 91 provides an impedance across which the received signal appears with respect to reference ground. The end terminal of this primary winding remote from ground is coupled through a capacitor 220 to the cathode of diode 222. The cathode of this diode is also connected through the series combination of resistors 226, 227 and 228 to ground. The junction of resistors 226 and 227 is bypassed to lead 32 by means of filter capacitor 230. This capacitor is made large to bypass both radio frequencies and audio frequencies so that the AGC lead 232 has impressed thereon a voltage which varies with the strength of the carrier of a received signal. The junction of resistors 227 and 228 is connected to one side of the secondary winding of transformer 48 which winding is also direct current coupled to resistor 62 to the base electrode of transistor 61. The junction of resistors 227, 228 is bypassed for signals appearing in the amplifier stage 60 by means of capacitor 240. Resistors 227 and 228 form a voltage divider to impress only a portion of the potential on lead 232 on the base of transistor 61.

The junction of resistors 226 and 227 is coupled through resistor 242 and inductor 23 to the base electrode of transistor 12 so that this transistor is also biased according to the potential on lead 232. As previously mentioned, capacitor 25 provides a signal bypass for the junction of inductor 23 and resistor 242. It may be noted that the bias potential applied to the base of transistor 12 is not divided down in contrast to that applied to base of transistor 61.

The anode of rectifier 222 is connected to the junction point of series connected resistors 250 and 251 which are coupled between potential supply lead 32 and ground. Resistor 250 is made relatively small compared to resistor 251 so that essentially the entire energizing potential appearing on lead 32 is applied to the anode of rectifier 222. It may be noted that this potential is of a polarity tending to cause conduction of rectifier 222 and this charges capacitor 220 to the potential appearing at the junction of resistor 250, 251. This charging path is through the primary winding of transformer 90. Furthermore, capacitor 220 being the diode coupling capacitor for the gain control detection network, charges to a potential dependent upon the strength of the incoming carrier signal. As previously stated, the resistor 226 and capacitor 230, as well as other resistors and capacitors in the entire network, provide filtering of the potential developed across capacitor 220 in order to filter radio frequency or audio frequency variation. The net result is that there is impressed on lead 232, in addition to the AGC potential, a direct current bias voltage which appears at the junction of resistors 250 and 251 and this provides the quiescent or steady state bias for the bases of transistors 12 and 61.

It may be appreciated that the quiescent base bias for transistors 12 and 61 is applied in series with the automatic gain control potential, which thus effectively "floats" on the quiescent bias. This has the advantage of reducing the loading effect of the quiescent bias network on the AGC detector and permits the development of a higher AGC potential in the relatively low impedance circuits in the receiver. Furthermore, the signal for the AGC detector is derived across the entire tuned circuit comprised of the primary winding of transformer 90 and the tuning capacitor 91 in order to maximize the developed AGC potential. Portable radio receivers and particularly mobile receivers such as used in automobiles, are sometimes operated in areas where signal strength is very high and it is necessary to develop a very great gain control potential in order to sufficiently reduce the signal level translation in transistor stages in order to prevent undue distortion in the various receiver stages. The above described circuit provides such an AGC potential.

Since the base to emitter impedances of the transistors 12 and 61 are comparatively low it is necessary to use an R-C audio filtering or integrating network having a relatively low resistance and high capacitance in the gain control detector system. If the resistance in the network were high the low impedance input circuit of the transistors would shunt this and reduce the developed voltage. On the other hand, the overall R-C product must be sufficiently great to provide the desired filtering of the audio signals in the detected signal so that only a carrier dependent voltage will be developed by the system. Capacitor 230 thus may have a very large value, for example, 25 microfarads.

It may be seen that capacitor 230 is connected between the lead 232, on which the detected AGC signal appears, and the lead 32 which is essentially at B+ or slightly below because the voltage drop due to resistor 136 and choke 135. As previously indicated, lead 232 will be established near the B+ potential because the rectifier 222 is connected to a source of bias potential which is virutally at the potential of lead 32. Therefore, the direct current voltage across capacitor 230 as caused by the operating potential of the receiver will be very low and may be of the order of 1 or 2 volts. This is to be contrasted to the 12 or more volts which would appear across capacitor 230 if this were connected between lead 232 and ground. In this latter situation a voltage change such as commonly occurs in the electrical system of automobiles would cause a relatively great charge change to take place in capacitor 230, during which time the AGC system of the receiver would be adversely affected.

Furthermore, since a relatively low direct current potential is impressed across capacitor 230 a desired charge change may take place thereacross more rapidly. For example, if an automobile in which the receiver is used is driven under a bridge or other structure wherein the available signal strength of a received signal is very low, the AGC potential on lead 232 will be reduced to increase the gain of the receiver. However, when the receiver emerges from the shielded area, the signal strength will sharply rise and it is desirable to have the AGC potential also rise in the minimum of time. This can take place in the circuit as shown wherein the very large integrating or filter capacitor for the AGC system is returned to the B+ lead or the emitter circuits of the transistors which are gained controlled.

In a receiver of practical construction which operated successfully in accordance with the teachings of the invention, the component parts had the following designations:

| | | |
|---|---|---|
| Transistor **12** | | 2N247 |
| Capacitor **18** | mmf | 100 |
| Capacitor **25** | mf | .1 |
| Capacitor **27** | mf | .002 |
| Transistor **61** | | 2N139 |
| Resistor **62** | ohms | 220 |
| Capacitor **220** | mmf | 15 |
| Diode **222** | | 1N295 |
| Resistor **226** | ohms | 15,000 |
| Resistor **227** | do | 10,000 |
| Resistor **228** | do | 150,000 |
| Capacitor **230** | mf | 25 |
| Capacitor **240** | mf | .05 |
| Resistor **242** | ohms | 10,000 |
| Resistor **250** | do | 390 |
| Resistor **251** | do | 6,800 |

The secondary winding of transformer 48 and the primary winding of transformer 90 tuned to 262.5 kilocycles.

Accordingly, the above described receiver comprises an improved circuit which is highly suitable for use in portable or mobile applications. The circuit is completely transistorized and includes an automatic gain control system providing a large control potential at high signal levels in order to reduce distortion in the receiver. The system further includes provision for rapid and stable response of the gain control system under adverse operating conditions for transistorized receivers, in addition to circuitry for reducing spurious signal response in the receiver.

I claim:

1. A wave signal receiver operative by an electrical system subject to potential variation and having a stage for translating a received signal and including a transistor having a variable signal translation level characteristic dependent upon application of a control potential thereto, gain control detector circuit means including impedance means across which the received signal appears with respect to a reference point and a rectifier device and detector capacitor means to develop a gain control potential with respect to the reference point, a direct current energizing circuit adapted to be connected to the electrical system for supplying an operating potential for the receiver with respect to the reference point, resistor means coupled to said detector capacitor means and to the transistor to apply thereto the gain control potential, and audio frequency filter capacitor means coupled between said resistor means and said direct current energizing circuit to form a filter for audio frequency signals demodulated by said gain control detector means with a potential substantially less than the operating potential across said capacitor means.

2. In a wave signal receiver having a plurality of receiver stages including a stage for translating a received signal which stage includes a transistor having a variable gain characteristic dependent upon application of a control potential applied thereto with respect to a reference point, the gain control and bias system including in combination, a direct current circuit adapted to supply an energizing potential for the receiver stages with respect to a reference point, resistor means connected to the transistor, a rectifier device having a first terminal connected to said direct current circuit and a second terminal connected to said resistor means, said rectifier device being poled to be conductive upon energization from said direct current circuit for applying a relatively fixed bias to the transistor through said rectifier device and said resistor means, circuit means including an impedance across which the received signal appears with respect to a reference point and a capacitor for applying such signal to said second terminal of said rectifier device to form a detector circuit for the received signal whereby a gain control potential variable with respect to signal strength is applied through said resistor means to the transistor.

3. In a wave signal receiver having a plurality of transistor stages including a stage with a transistor having a variable gain characteristic dependent upon application of a control potential applied to a base thereof with respect to a reference point, the gain control and bias system including in combination, a direct current supply circuit adapted to supply an energizing potential for the stages with respect to a reference point, resistor means connected to the base of the transistor for conducting a bias thereto, a rectifier device having a first terminal connected to said direct current supply circuit and a second terminal connected to said resistor means, said rectifier deivce being poled to be conductive upon energization from said direct current supply circuit for applying the quiescent bias to the base of the transistor through said rectifier device and said resistor means, circuit means including a tuned circuit across which the received signal appears with respect to the reference point, a capacitor cooperating with said resistor means and said rectifier device to form a gain control detector circuit for the received signal, said capacitor being connected to said tuned circuit to apply the received signal to said rectifier device, and capacitor means for bypassing said resistor means to the reference point whereby a gain control potential variable with respect to the signal strength is applied through said resistor means to the transistor.

4. In a wave signal receiver having a plurality of transistor stages including a transistor having a variable gain characteristic dependent upon application of a control potential applied to a base electrode thereof with respect to a reference point, the gain control and bias system including in combination, a direct current energizing circuit adapted to supply an operating potential for the stages with respect to a reference point, resistor means connected to the reference point and to the base electrode of the transistor, a rectifier device having a first terminal connected to said resistor means and further having a second terminal, a resistive voltage divider connected between said direct current energizing circuit and the reference point and including an intermediate point connected to said second terminal, said rectifier device being poled to be conductive upon energization from said voltage divider and energizing circuit for applying the quiescent bias to the base electrode solely through said rectifier device and a portion of said resistor means, circuit means including an impedance across which the received signal appears with respect to the reference point and a capacitor for applying such signal to said first terminal of said rectifier device to form a detector circuit for the received signal, whereby a potential variable with respect to the signal strength is applied through a portion of said resistor means to the transistor.

5. In a wave signal receiver having a plurality of transistor stages including an amplifier with a PNP transistor having a variable gain characteristic dependent upon application of a control potential applied to a base electrode thereof with respect to a reference point, the gain control and bias system including in combination, a B+ current supply circuit adapted to supply an energizing potential for the stages with respect to a reference point, resistor means connected to the base electrode of the transistor for conducting a bias thereto, a diode having an anode connected to said B+ current supply circuit and a cathode connected to said resistor means, said diode being conductive upon energization from said B+ supply circuit for applying the entire quiescent bias to the base electrode of the transistor through said diode and said resistor means, circuit means including an impedance across which the received signal appears with respect to the reference point and a capacitor for applying such signal to said cathode of said rectifier device to form a gain control detector circuit for the received signal, and capacitor means for bypassing said resistor means to the reference point whereby a gain control potential variable with respect to the signal strength is applied through said resistor means to the base electrode.

6. In a wave signal receiver operative from a vehicular electrical system and having a plurality of transistor stages including an amplifier with a transistor having a variable gain characteristic dependent upon application of a control potential applied to a base electrode thereof with respect to a reference point, the gain control and bias system including in combination, a direct current supply circuit adapted to be connected to the electrical system to supply an energizing potential for the stages with respect to a reference point, resistor means connected to the base electrode for conducting a bias thereto, a rectifier device having a first terminal connected to said direct current supply circuit and a second terminal connected to said resistor means, said rectifier device being poled to be conductive upon energization from said direct current supply circuit for applying the quiescent bias to the base electrode through said rectifier device and said resistor means, circuit means including an impedance across which the received signal appears with respect to the reference point, and a capacitor cooperating with said resistor means and said rectifier device to form a gain control detector circuit for the received signal, said capacitor being connected to said tuned circuit to apply the received signal to said rectifier device, audio signal filter capacitor means connected between said resistor means and said direct current supply circuit whereby a gain control potential variable with respect to the signal strength is applied through said resistor means to the base electrode.

7. In a wave signal receiver operative from a vehicular electrical system and having a plurality of transistor stages including an amplifier with a PNP transistor having a variable gain characteristic dependent upon application of a control potential applied to a base electrode thereof with respect to a reference point, the gain control and bias system including in combination, a B+ current supply circuit adapted to be connected to the electrical system to supply an energizing potential for the stages with respect to a reference point, resistor means connected to the base electrode of the transistor for conducting a bias thereto, a diode having an anode connected to said B+ current supply circuit and a cathode connected to said resistor means, said diode being conductive upon energization from said B+ supply circuit for applying the entire quiescent bias to the base electrode of the transistor through said diode and said resistor means, circuit means including an impedance across which the received signal appears with respect to the reference point and a capacitor for applying such signal to said cathode of said rectifier device to form a gain control detector circuit for the received signal, and audio signal bypass capacitor means connected between said resistor means and said B+ current supply circuit whereby a potential substantially less than B+ appears across said capacitor means and a gain control potential variable with respect to the signal strength is applied through said resistor means to the base electrode.

References Cited in the file of this patent

UNITED STATES PATENTS

| | | |
|---|---|---|
| 2,172,160 | Dome | Sept. 5, 1939 |
| 2,281,661 | Barton | May 5, 1942 |
| 2,290,705 | Pfost | July 21, 1942 |
| 2,653,226 | Mattingly | Sept. 22, 1953 |
| 2,666,817 | Raisbeck et al. | Jan. 19, 1954 |
| 2,754,415 | Schmidt | July 10, 1956 |
| 2,802,100 | Beck et al. | Aug. 6, 1957 |
| 2,810,071 | Race | Oct. 15, 1957 |
| 2,866,892 | Barton | Dec. 30, 1958 |
| 2,885,544 | Radcliffe | May 5, 1959 |
| 2,929,926 | Fibrang | Mar. 22, 1960 |
| 2,939,950 | Holmes | June 7, 1960 |